United States Patent [19]

Prammer

[11] Patent Number: 5,517,115
[45] Date of Patent: May 14, 1996

[54] EFFICIENT PROCESSING OF NMR ECHO TRAINS

[75] Inventor: Manfred G. Prammer, West Chester, Pa.

[73] Assignee: Numar Corporation, Malvern, Pa.

[21] Appl. No.: 168,600

[22] Filed: Dec. 16, 1993

[51] Int. Cl.$^6$ ................................................. G01R 33/20
[52] U.S. Cl. .......................................... 324/303; 324/307
[58] Field of Search ................................... 324/300, 307, 324/309, 303; 128/653.2

[56] References Cited

U.S. PATENT DOCUMENTS

| | | | |
|---|---|---|---|
| 4,717,877 | 1/1988 | Taicher et al. | 324/303 |
| 4,980,640 | 12/1990 | Van Ormondt et al. | 324/307 |
| 5,023,551 | 6/1991 | Kleinberg et al. | 324/303 |
| 5,218,299 | 6/1993 | Dunkel | 324/307 |
| 5,302,896 | 4/1994 | Dechene et al. | 324/300 |
| 5,363,041 | 11/1994 | Sezginer | 324/303 |
| 5,367,260 | 11/1994 | Dechene et al. | 324/307 |

Primary Examiner—Sandra L. O'Shea
Assistant Examiner—Raymond Y. Mah
Attorney, Agent, or Firm—Pennie & Edmonds

[57] ABSTRACT

A method and apparatus is disclosed for efficient processing of nuclear magnetic resonance (NMR) echo trains in well logging. Apriori information about the nature of the expected signals is used to obtain an approximation of the signal using a set of pre-selected basis functions. A singular value decomposition (SVD) is applied to a matrix incorporating information about the basis functions, and is stored off-line in a memory. During the actual measurement, the apparatus estimates a parameter related to the SNR of the received NMR echo trains and uses it to determine a signal approximation model in conjunction with the SVD of the basis function matrix. This approximation is used to determine in real time attributes of the earth formation being investigated.

29 Claims, 5 Drawing Sheets

EFFICIENT PROCESSING OF NMR ECHO TRAINS

FIELD OF THE INVENTION

The present invention relates to nuclear magnetic resonance (NMR) sensing methods for determining characteristic properties of materials under investigation. Specifically, the invention relates to an efficient method of processing NMR echo signals in well logging for the purposes of oil exploration.

BACKGROUND OF THE INVENTION

NMR sensing methods are based on the interaction between certain kinds of atomic nuclei and an applied magnetic field. Specifically, atomic nuclei such as those of hydrogen atoms having angular momentum ("spin") and thus a magnetic moment tend to align themselves with the applied field the same way a compass needle aligns with the Earth's magnetic field. This alignment process is primarily determined by the parameters of the applied magnetic field, such as its amplitude, frequency and direction. When the applied magnetic field is turned off, the nuclei which were aligned gradually return to their initial state. This process known as relaxation generates a measurable signal which can be picked up and recorded by sensor instruments. The relaxation signal carries useful information about the number of reacting nuclei, the rate of exchange of energy between the nuclei and the surrounding material, the composition and structure of this material, etc.

To maximize the amount of useful information about the underlying structure of the material under investigation, NMR sensing devices typically apply controlled sequences of magnetic field pulses to a given volume of the material. The sensing devices then detect and record the received "echo" signals and use signal processing algorithms to extract the desired information from the recorded measurement signals.

For example, nuclear magnetic logging tools such as those disclosed in U.S. Pat. Nos. 4,710,713; 4,717,876; 4,717,877 and 4,717,878, assigned to the same assignee and incorporated herein by reference, measure the nuclear magnetic relaxation rates of hydrogen atoms in the pore spaces of earth formations. To this end, a pre-determined high-energy NMR pulse sequence is applied by the tool to the earth formation of interest. The pulse sequence transmits energy at given frequencies thereby disturbing the equilibrium of the hydrogen atoms within the formation. Upon termination of the pulse sequence, the logging tool monitors the returning echo signals as the hydrogen atoms return back to an equilibrium state. The received signals are used to estimate critical parameters in oil exploration which may be properties of the earth formation, such as its porosity, permeability, the irreducible water saturation, residual oil saturation, etc.

To determine the properties of the material under investigation, some of the most frequently used parameters in the analysis of the measured NMR echo signals include: the amplitude of the signal at time t=0 immediately after the magnetic field is turned off; the spin-lattice relaxation time constant $T_1$, also known as longitudinal relaxation time; and the spin-spin relaxation time constant $T_2$.

The initial amplitude of the response signal is of special importance in NMR sensing because it directly correlates with the number of hydrogen atoms in the formation (and thus to the probability of finding oil within an earth formation). The $T_1$ constant indicates the time required for the system to come to a complete thermal equilibrium with its surroundings upon termination of the applied magnetic field. Its value is determined by the molecular environment and typically ranges from 10 to 1000 milliseconds for different types of rocks. The spin-spin relaxation time constant $T_2$ is indicative of the phase degeneration among signals from individual nuclei due to inhomogeneities in the earth's magnetic field throughout the sample, the type and quantity of fluid, its temperature, viscosity and distribution within the formation. Well known formulas can be applied to derive from these parameters the relevant information regarding the structure of the material under investigation. (See A. Timur, "Pulsed Nuclear Magnetic Resonance Studies of Porosity, Movable Fluid and Permeability of Sandstones" Journal of Petroleum Technology, Jun. 1969, pp. 775–786).

A number of problems are associated, however, with the practical determination of these and other parameters of the received NMR echo signals. Such problems may arise from erroneous signal measurements due to tool calibration inaccuracies, time varying magnetic field pulse parameters, non-negligible logging speed, and especially measurement noise. In addition, only the $T_2$ relaxation time (or rather the related $T_2^*$ time) of the echo signal is a directly measurable quantity. On the other hand, because of the large magnitudes of the magnetic fields which are used in well logging, the sensing electronics has a "dead time" immediately following the pulse sequence, during which time the echo signal is not observable. Thus, the initial amplitude of the received signal cannot be measured directly and has to be determined by the use of mathematical modeling. Other parameters of interest, such as the $T_1$ constant, are similarly not available for direct observation and need to be derived from the measured signal by the use of mathematical models. It is thus clear that in the practice of NMR sensing it is necessary to process noise corrupted measurement signals, and is important to derive accurate mathematical models of these signals in order to properly analyze them.

Several approaches have been proposed in the past in this respect. A number of prior art techniques reduce systematic measurement errors by optimizing the parameters of the applied magnetic field. A survey of the available techniques, including the "inversion recovery"; "preparation recovery"; "progressive saturation" and "magnetization conserving" techniques is presented in Levy and Peat, "The Experimental Approach to Accurate Carbon-13 Spin-Lattice Relaxation Measurements," Journal of Magnetic Resonance 18, pp. 500–521, 1975. Pulse sequences having optimal measurement parameters, such as the Carr-Purcell-Meiboom-Gill (CPMG) sequence and modifications of it, have also been developed and are currently accepted as industry standards.

Other prior art NMR sensing methods rely on increasing the accuracy of the obtained measurements by increasing the signal-to-noise (SNR) ratio of the obtained signal. For instance, U.S. Pat. No. 4,631,480 to Young, discloses a method to reduce the measurement noise by using a quantity of a material of known NMR properties in the region under investigation to enhance the measured response signal.

In a different approach, improvements have been made in the mathematical modeling of the measurement signal and the use of signal processing algorithms to reduce the effects of the noise. The simplest signal model frequently used in NMR sensing assumes that the process of relaxation of most materials can be represented by a single exponential decay function. However, research has shown that this model is inadequate to describe the actual processes and may lead to erroneous results. Therefore, most advanced NMR sensing techniques use models in which the measurement signal V(t) obtained in NMR sensing is represented as a sum of independent, decaying exponential signals:

$$V(t) = \phi \sum_{i}^{n} A_i \exp(-t/T_i)$$

where $\phi$ is a constant, n is the order of the assumed model, and $A_i$ and $T_i$ are the unknown amplitudes and time constants associated with the relaxation process of different materials or pore sizes within the volume under investigation.

While the approximation of NMR echo signals using the model above is intuitively clear and accurately represents the underlying processes of relaxation in an earth formation, its practical application is associated with considerable difficulties. The reason is that in order to obtain good results, one has to first estimate the order n of the approximation, and then solve a set of non-linear equations for the unknown parameters. As well known in the art, non-linear equations are relatively complex to solve and, in addition, their solutions are frequently unstable and sensitive to small changes in the initial conditions or the measurement noise.

Prior art solutions seek a solution to the problem of mathematical modeling the received echo signals by the use of several techniques, including the graphical "backward projection" technique, (See for example Van Liew, "Semilogarithmic Plots of Data Which Reflects a Continuum of Exponential Processes," *Science*, 138, 1962); the use of non-linear regression analysis of the measurement signal; non-linear least square fit routines, as disclosed in U.S. Pat. No. 5,023,551, and others. Other prior art techniques include a variety of signal modeling techniques, such as polynomial rooting, singular value decomposition (SVD) and miscellaneous refinements thereof, to obtain a better approximation of the received signal. A common problem with prior art signal models is that their derivation is computationally intensive and rarely takes into account user knowledge about the actual measurement process.

Consider for instance U.S. Pat. No. 4,973,111 to Haacke which describes a method for parametric image reconstruction from sampled NMR measurement data. In the proposed technique, the desired object function is approximated by a series of known model functions having a finite number of unknown parameters. Because the direct equations are highly non-linear, the problem is simplified by using all-pole parameter estimation, in which the unknown parameters are the roots of a polynomial equation. The coefficients of this equation are obtained as the solution vector to a system of linear prediction equations which involve the received measurement data. The solution of the linear prediction system, as suggested in Haacke, is found by applying SVD decomposition to the linear prediction data matrix of the measurement signal. This approach is shown to reduce the effects of the measurement noise and estimate the order of the model functions, resulting in an approximation which is guaranteed to be optimal in a linear least squares sense.

Due to the large size of the involved matrices, however, the method is computationally quite intensive and while suitable for off-line processing does not lend itself to real-time applications of NMR well logging. In addition, the method does not take into account information about the material under investigation or the measurement process, which can be used to simplify the computations.

Thus, notwithstanding the advances in the prior art, it is perceived that the problems involved in the parameter model estimation used in NMR sensing methods for well logging have not yet been resolved. In particular, no simple methods have been proposed to take advantage of prior knowledge about the structure of the investigated material and the signal-to-noise (SNR) ratio of the received echo signal. Also, no efficient solutions have been proposed to combine advanced mathematical models with simple signal processing algorithms to increase the accuracy and numerical stability of the parameter estimates. Finally, existing solutions require the use of significant computational power which makes the practical use of those methods inefficient, and frequently impossible to implement in real-time applications.

SUMMARY OF THE INVENTION

Accordingly, it is an object of the present invention to provide an improved method and apparatus for real-time processing of NMR measurement signals.

It is another object of the present invention to provide an efficient method and apparatus of processing measurement signals from a NMR logging tool, in order to derive properties of an earth formation under investigation.

Another object of the invention is to provide an improved method of modeling NMR measurement signals, characterized by the use of apriori information about the nature of the expected measurement signals, and the use of information about the SNR of the measurement for real-time applications.

Yet another object of the present invention to present a method for processing NMR signals which uses a simple estimate of the SNR of the measurement data, and singular value decomposition (SVD) of a matrix incorporating information about signal independent basis functions to improve the numerical stability of the computations.

In accordance with a preferred embodiment of the present invention, a numerically stable method is presented for analyzing NMR logging tool measurements to determine attributes of a material under investigation. The received NMR measurement signals are approximated by a set of linearly independent basis functions which have a functional description similar to that of the expected measurement signal. In the case of NMR well logging, the expected signal is frequently represented mathematically as a sum of exponentially decaying signals. A basis function can be selected as a single function or a weighted sum of functions. A set of about 3 to 80 such basis functions with different parameters (e.g. time constants) may be chosen prior to the actual measurement to cover the range of expected signals in a particular application. One possible choice for the time constants of the exponential basis functions is to use consecutive powers of 2 (i.e. 1, 2, 4, . . . , etc.). Other choices are possible and can be made dependent on the particular application.

The parameters of the approximation are computed by forming a system of linear equations relating the selected set of basis functions and a measurement vector derived by sampling of the NMR measurement signals at a pre-specified time interval. The system of equations is readily presentable as a matrix equation Ax=b which can be solved using standard software routines. In order to improve the numerical stability of the computation and obtain an optimal in mean-squares sense solution, it is proposed to apply an orthogonal transformation, preferably a singular value decomposition (SVD), of the matrix which contains information about the basis functions, and compute parameters of the approximation as the solution vector of the matrix equation. The solution is guaranteed to be optimal even when the actual measurement signal is not in the range of the selected basis functions.

The proposed method imposes a feasibility constraint on the solution of the matrix equation, which is the requirement that the components of the solution vector be non-negative. Physically, this constraint corresponds to the requirement that the approximating functions are actually present in the measurement signal, as opposed to being a mathematical abstraction.

The SVD decomposition of the basis function matrix is computationally intensive and relatively time consuming. For this reason it may be computed in a preprocessing stage, prior to the actual NMR measurements. The matrix decomposition may be stored in memory means for subsequent use. As part of the pre-processing stage one may also selectively remove basis functions one by one from the basis function matrix and repeat the steps of computing and storing the SVD decomposition of the resulting reduced-size matrices. These matrices can be used in case the solution vector of the basis function matrix has one or more negative components. As explained above, such case is defined in the method of the present invention as infeasible and the corresponding negative-most solution vector component is substituted by a zero value.

The second stage of the method is the actual NMR measurement which is computed on-line and comprises the steps of imparting a polarizing magnetic field signal to a material under investigation for a predetermined period of time; receiving NMR signals from a population of particles in this material following the polarization period; constructing a mapping of the received NMR signals from the signal space into a parameter space of the basis function matrix, which steps corresponds to solving the matrix equation involving the basis function matrix and the measurement vector, and obtaining a solution vector the components of which are parameters of the desired approximation of the received signals; and determining from the provided approximation an indication of attributes of the material under investigation.

In accordance with a preferred embodiment of the present invention, prior to the step of solving the matrix equation, the singular values of the basis function matrix, which are ordered in terms of their amplitudes are weighted depending on a parameter which is related to the SNR of the received signal. This parameter reflects the ratio between the amplitudes of the signal and the noise in a particular measurement and is estimated on-line.

In accordance with the proposed method, the SNR parameter is compared to the ratios of the largest singular value to all singular values of the basis function matrix. (Note that the ratio of the largest to the smallest singular values of a matrix is directly related to the condition number of the matrix and thus to the numerical stability of any computations involving the matrix). Basis functions which correspond to singular values for which the ratio is smaller than the SNR parameter are fully retained in the computed solution. Basis functions which correspond to singular values for which the ratio is larger than the SNR parameter are excluded from further consideration, by setting the corresponding singular values of the matrix equal to zero. Removing smaller singular values from the computation effectively stabilizes the numerical solution of the system for a given measurement SNR.

The weighing process is equivalent to adjusting the condition number of the basis function matrix dependent on the SNR of the measurement signal. When the SNR is high, there is more confidence in the values of the received NMR signals, thus higher instability of the matrix equation may be tolerated. Alternatively, if the measurements are noisy, one should only use the dominant basis functions, so that the solution is not distorted by numerical inaccuracies.

If the estimated SNR parameter falls between two singular value ratios, as defined above, one may define a measure of confidence or a "fractional rank" of the matrix with respect to the particular measurement. Specifically, the integer part of the matrix rank may be determined as the order of the singular value corresponding to the smaller amplitude ratio, while the fractional part may be determined by some measure related to how close the SNR parameter is to the larger ratio. The correspondent singular value of the matrix is weighted dependent on the fractional part of the matrix rank for the specific measurement.

After the weighing of the singular values of the matrix is complete, the solution of the matrix system may be found as known in the art. If none of the components of the solution vector is negative, in accordance with the present invention the approximation parameters are found and can be used to determine attributes of the material under investigation. Should one or more of the solution vector components have a negative value, the method proceeds by excluding from consideration the basis function corresponding to the solution vector component having the negative most value. The negative-most component of the solution vector is set to zero and the analysis is repeated for a submatrix of the original basis function matrix having the corresponding basis function removed. The steps of the method are repeated until all solution vector components are non-negative.

In one embodiment of the present invention, after a feasible solution vector is found, the error between the measured signal and the approximation signal may be computed and evaluated using well-known statistical criteria to determine how good the approximation is. If the signal approximation is unsatisfactory, one may repeat the NMR measurements a predetermined number of times to effectively increase the SNR of the measurement by averaging the received signal data prior to solving for the approximating parameters.

The NMR signal model computed using the present method is next used to estimate the desired parameters of the material under investigation such as the typical pore size of the earth formation and others.

A second preferred embodiment of the present invention is a method for processing NMR signals in well logging comprising the steps of: generating a static magnetic field substantially perpendicular to the axis of a bore hole in a region surrounding the bore hole which region includes material sought to be analyzed; generating a radio frequency magnetic field in the region in a direction substantially perpendicular to both the axis of the bore hole and to the static magnetic field for exciting nuclei of the material sought to be analyzed; receiving NMR signals from the excited nuclei; constructing a mapping of the received signals from the signal space into a parameter space associated with a predetermined set of basis functions, wherein the mapping step comprises obtaining parameters to provide an approximation of the received signals; and determining from the obtained parameters an indication of attributes of the material sought to be analyzed.

In this embodiment, the mapping step further comprises the steps of: defining a matrix incorporating information about the set of basis functions; forming a linear system of equations for the defined matrix and a measurement vector constructed from the received NMR measurement signals; and solving the system of linear equations to obtain parameters to provide an approximation of the received signals. The solution of the linear system of equations is obtained by applying SVD to the defined matrix and by weighing the singular values of the matrix in accordance with a parameter dependent on the SNR of the received signal measurement.

Specifically, the singular values of the matrix are weighted by factors depending on the fractional rank of the matrix with respect to the particular measurement, where the fractional rank is determined by comparing the ratios between the largest and all other singular values of the basis functions matrix and the value of the parameter dependent on the SNR of the received signal measurement.

The basis functions in one embodiment of the present invention are exponentially decaying functions $\exp(-t/T_i)$ with different time constants $T_i$, which may be selected as powers of 2. A measure of goodness of the approximation may also be determined and should it be found unsatisfactory, the steps of measuring the received NMR signals may be repeated a predetermined number of times until a desired measurement SNR is reached.

Another aspect of the present invention is an apparatus which is capable of performing the method steps in accordance with the embodiments of the proposed NMR sensing method described above.

The method and apparatus of the present invention improve over the prior art in that they enable one to perform real-time NMR measurements of parameters of a material under investigation. The proposed method incorporates apriori knowledge about the material and the nature of the expected measurement signals and uses this knowledge for efficient processing which involves reduced computational effort.

The application of the method of the present invention is also advantageous in that the computation is guaranteed to be numerically as stable as possible. Furthermore, the singular values of the basis function matrix are closely associated with the stability of the solution. This relationship allows one to quickly estimate whether the proposed set of basis functions is suitable for the approximation and possibly find a substitute set, if necessary. Finally, since the basis functions are predetermined, the time consuming computation of the matrix SVD may be done off-line, in a preprocessing stage preceding the actual measurements. The on-site NMR measurements, on the other hand, involve simple mathematical operations which can be performed efficiently with reduced computational effort.

In addition to NMR measurements, the method of the present invention can be used in the processing of magnetic resonance imaging (MRI) signals and is in general applicable in any case where apriori knowledge of the nature of the expected signal can be used to form a set of related basis functions. Following the method of the present invention it is then possible to compute on-line an accurate mathematical model of the actual received measurements signals and use the model for other practical purposes.

BRIEF DESCRIPTION OF THE DRAWINGS

For the purposes of understanding of the principles of this invention, reference is now made to the drawings, wherein.

DETAILED DESCRIPTION OF THE INVENTION

Figure 1:
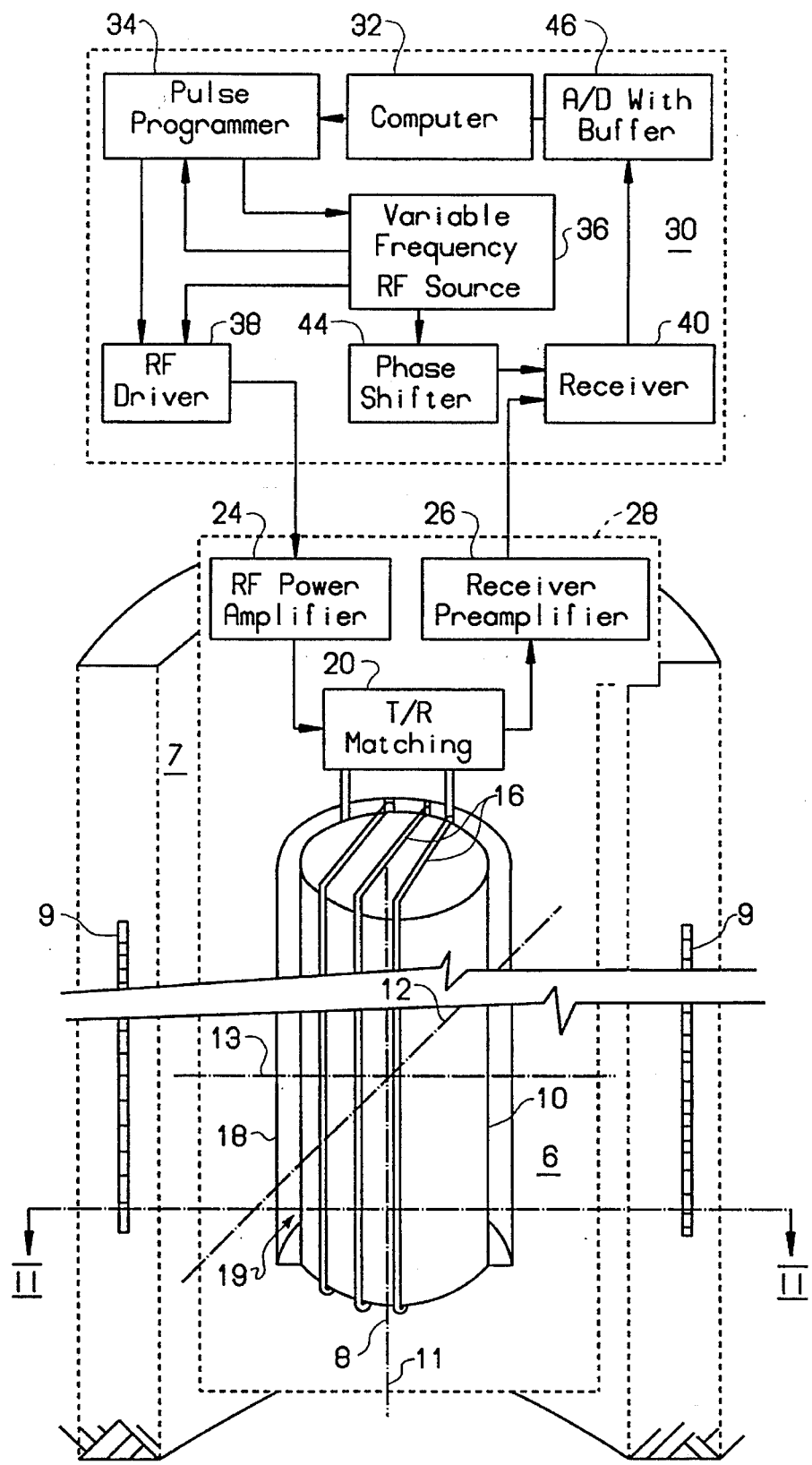
FIG. 1 is a partly pictorial and partly block diagram illustration of a well logging apparatus, operative in accordance with the present invention.

Reference is first made to FIG. 1, which illustrates in a partly pictorial and partly block diagram form a well-logging apparatus constructed in accordance with a preferred embodiment of the present invention. The apparatus, shown in operative position, comprises a first portion 6, which is adapted to be lowered into bore hole 7, and control circuitry enclosed in housing 30 which is preferably located above ground. The material to be investigated lies in a region 9 spaced from and surrounding bore hole 7 which has a generally cylindrical configuration and a longitudinal axis 8.

First portion 6 of the well logging apparatus comprises a substantially cylindrical permanent magnet 10, which has a generally circular cross-section and a longitudinal axis 11 which is preferably coaxial with the axis 8 of the bore hole. Permanent magnet 10 is magnetized along magnetization axis 12 which is substantially perpendicular to the longitudinal axis 11. First portion 6 also comprises one or more coil-windings 16 which are arranged on the surface of permanent magnet 10 such that each coil turn lies in a plane substantially parallel to a plane containing axes 12 and 11. Specifically, axis 13 of the coil-windings 16 is substantially perpendicular to both axis 11 and axis 12 of the permanent magnetization.

Permanent magnet 10 and coil windings 16 of first part 6 are preferably housed in a non-conductive, non-ferromagnetic protective housing 18. The housing and its contents are also referred to as a probe 19. The coil windings 16, together with a transmitter/receiver matching circuit 20 form a transmitter/receiver (T/R) circuit, which is coupled to a RF power amplifier 24 and a receiver preamplifier 26.

Disposed in housing 30 is control circuitry for the logging apparatus including a computer 32 which provides a control output to a pulse programmer 34 which receives RF input from a variable frequency RF source 36. Pulse programmer 34 controls the operation of the variable frequency RF source 36 as well as an RF driver 38, which receives an input from source 36 and outputs to RF power amplifier 24.

The output of RF receiver preamplifier 26 is supplied to an RF receiver 40 which receives an input from a phase shifter 44. Phase shifter 44 receives input from variable frequency RF source 36. Receiver 40 outputs via an A/D converter with buffer 46 to computer 32 for providing desired well logging output data for further use and analysis. Computer 32 has means for analyzing the output data in accordance with the method of the present invention. All electronic elements which are normally contained in housing 28 or 30 may be located either above ground or be passed through the bore hole.

In operation, the apparatus of the present invention generates a substantially uniform static magnetic field in the region which includes material 9 sought to be analyzed. The magnetization direction is substantially perpendicular to axis 8 of the bore hole. Next, the T/R circuit generates a radio frequency magnetic field in a direction substantially perpendicular to both axis 8 of the bore hole and to the static magnetic field for exciting nuclei of the material 9 to be analyzed. Various types of magnetic field sequences, such as the Carr-Purcell-Meiboom-Gill (CPMG) sequence and modifications of it, can be used, as well known in the art.

NMR signals from the excited nuclei in material 9 are next received and possibly recorded in storage means in computer 32. The received NMR signals are then analyzed in accordance with the method of the present invention, to be described in detail. Finally, the results of the analysis are used to determine an indication of attributes of the material 9 sought to be analyzed.

Further details of the construction and operation of the logging apparatus used in accordance with the present invention are disclosed in U.S. Pat. Nos. 4,710,713; 4,717,876; 4,717,877 and 4,717,878, assigned to the same assignee and incorporated herein by reference.

Figure 3:
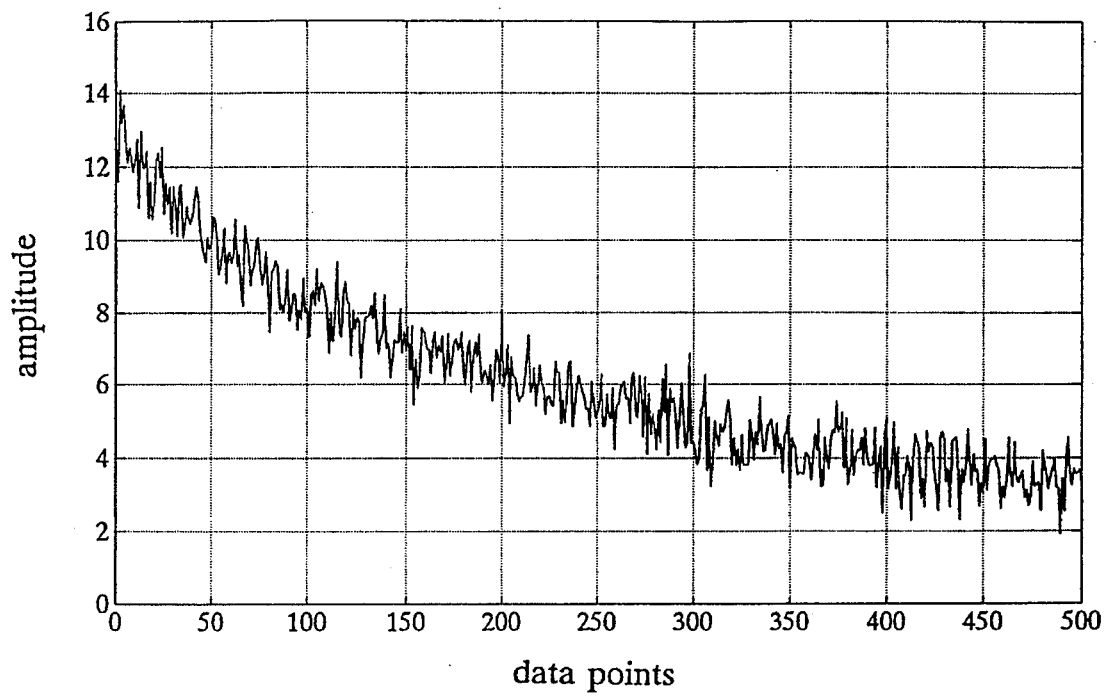
FIG. 3 is a sample of recorded NMR echo signals to be processed.

FIG. 3 presents a segment of a NMR signal which is typical of the type of data encountered in actual NMR oil exploration. In this figure, 500 data points represent the received echo signal from a NMR polarization sequence. The signal is from a well-defined volume of rock (approximately 2 liters), located at a depth of 1,225 ft in a test well. The signal was sampled every 1 msec, for a total acquisition time of 500 msec. Since only the hydrogen atoms in liquids contribute to this type of NMR echo signal, the initial intensity at time zero (not observable) represents the amount of fluid-filled pore space. The y-axis in FIG. 3 is calibrated in percents of the total rock volume.

Figure 2:
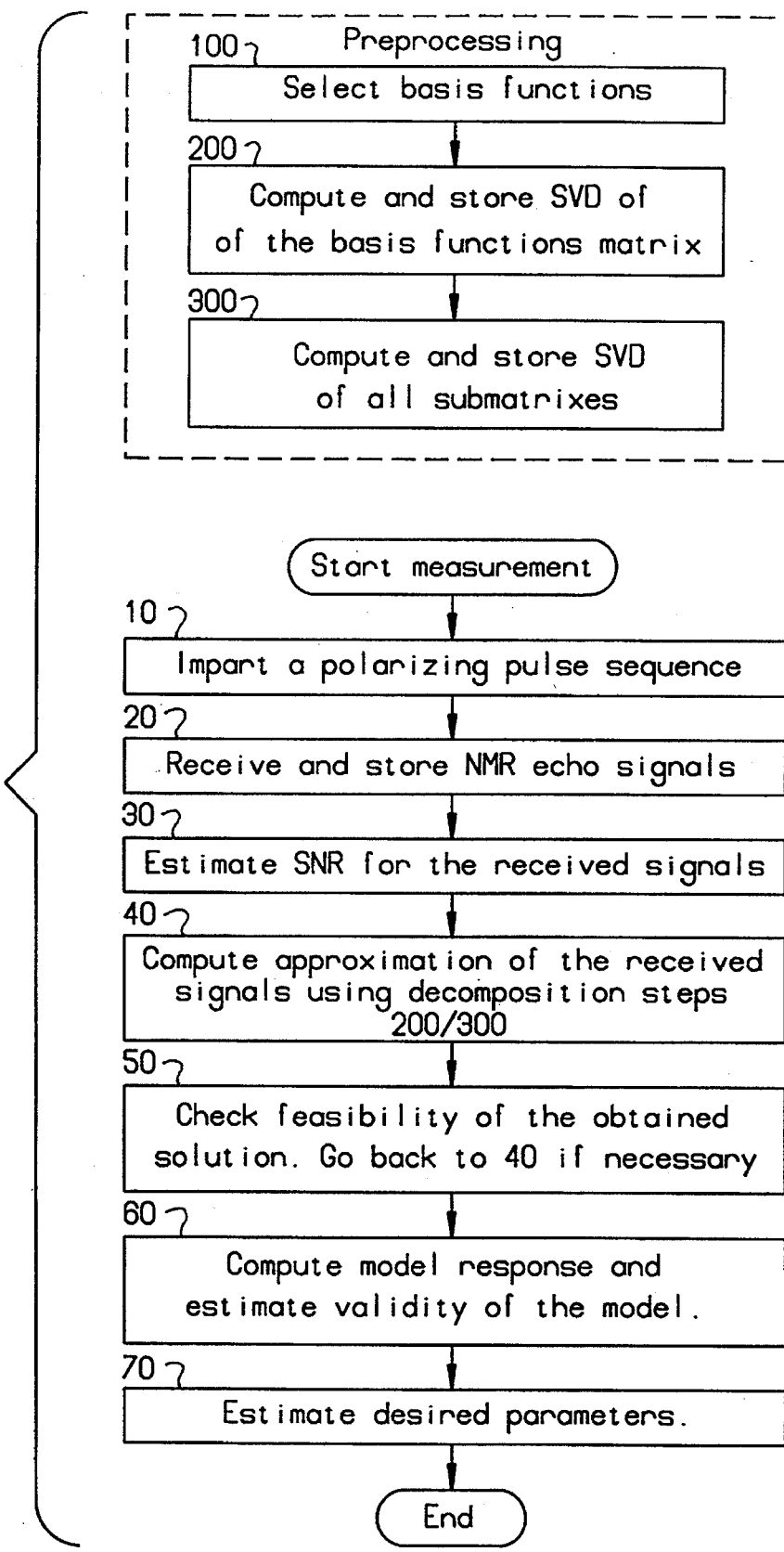
FIG. 2 is a block diagram of the NMR signal analysis method of the present invention.

In accordance with a preferred embodiment of the present invention, a numerically stable method is presented of analyzing NMR logging tool measurement signals, such as the one illustrated in FIG. 3, to determine properties of the material under investigation. FIG. 2 presents a block diagram of the analysis method in accordance with the present invention.

As shown in FIG. 2, the proposed method generally comprises two stages, a pre-processing stage which includes most of the computationally intensive steps, and an actual measurement stage which is performed in real time. Alternatively, all steps of the method can be performed in real time.

At step 100 of the method, NMR measurement signals are approximated by a set of linearly independent basis functions which have a functional description similar to that of the expected measurement signal. In the case of NMR well logging, the expected signal is often modeled by at least one exponentially decaying function with time constant(s) which may vary dependent on the logging site, the presence of water or oil in the volume being investigated, the typical pore sizes of the earth formation in the region, and others.

The description and number of basis functions is selected on the basis of prior knowledge of the nature of the received signals. A set of about 3 to 80 such basis functions, may be chosen to cover the range of expected signals in a particular application. In one embodiment of the present invention the basis functions are mathematically described as $\exp(-t/T_i)$ where t is the running time and $T_i$ is the time constant. In addition, basis functions may be selected as a weighted sum of these or other mathematical functions, or have any mathematical description suitable for the particular application.

If the basis functions are exponential, one possible choice for their time constants is to select consecutive powers of 2 (i.e. 1, 2, 4, . . . , etc.). This choice was found in practice to be sufficient to adequately cover the range of observed signals for NMR measurement signals in oil exploration. Other power series, such as based on 1.1 and 1.2 have also been found satisfactory for a particular application. Naturally, if the expected signal has a different functional description, other basis functions may be selected instead.

Figure 5:
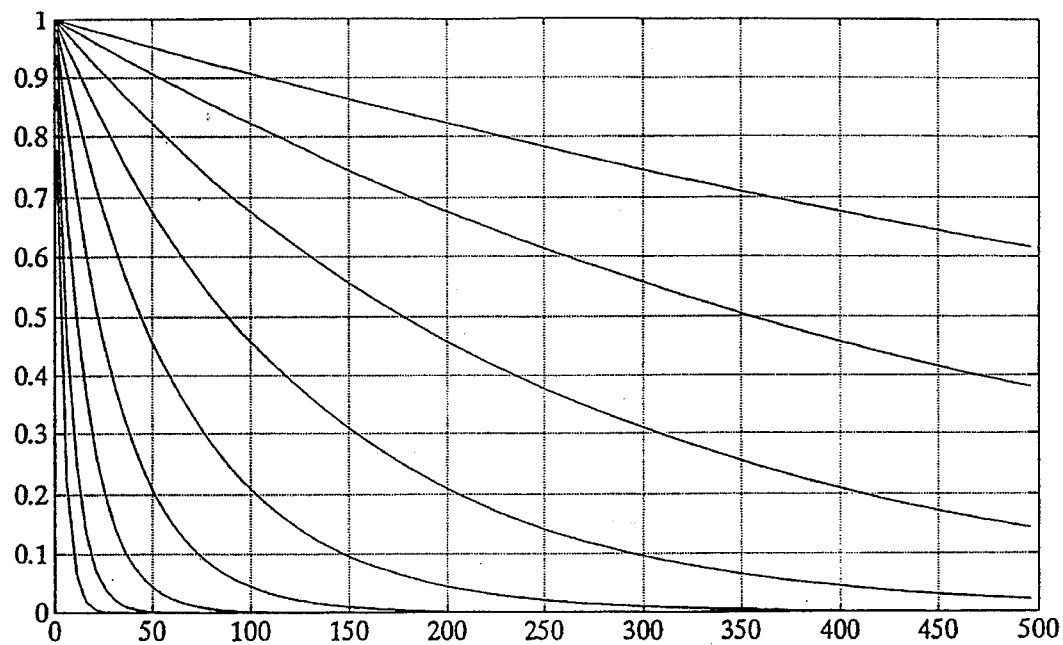
FIG. 5 illustrates a set of independent basis functions, used in the approximation of the NMR measurement signal.

FIG. 5 illustrates 9 exponentially decaying time functions which can be used in accordance with the proposed method as signal independent basis functions. All signal amplitudes are normalized to one, and the time constants $T_i$ are ordered as powers of 2 (2, 4, 8, 16, 32, 64, 128, 256 and 512, where the smaller time constants correspond to a faster decay). Five hundred sample points corresponding to a sampling period of 1 msec are displayed for each basis function.

At step 200 of the method, basis function vectors corresponding to the sampled and digitized basis functions are first arranged as columns of a basis function matrix A. (In the sequel, matrices and vectors are denoted in bold face). The basis function matrix is used during the actual measurement to form a system of linear equations relating the selected set of basis functions and a measurement vector b derived by sampling of the NMR measurement signals at pre-specified time intervals. The system of equations is readily presentable as a matrix equation Ax≅b where x is a vector of unknown parameters used in the signal approximation. The approximate solution vector x of the linear system of equations, as determined by least-squares analysis, determines the contribution of each basis function to the NMR signal approximation.

In order to improve the numerical stability of the computation and obtain an optimal in least-squares sense solution even when the actual measurement signals are not in the range of the selected functions, at step 200 of the method an orthogonal transformation, preferably a singular value decomposition (SVD), of the basis function matrix A is applied.

The singular value decomposition is at present perhaps the most powerful tool for finding a numerically stable solution of a system of linear equations. Any rectangular matrix A can be decomposed into $$A = U\ S\ V^T,$$

where $^T$ denotes transpose, U and V are orthogonal matrices whose columns correspond to the eigenvectors of the matrices $AA^T$ and $A^TA$ respectively, and S is a diagonal matrix with non-negative entries called singular values which are ordered in terms of amplitude and present the square roots of the non-zero eigenvalues of both $AA^T$ and $A^TA$. The singular values are also related to the ratio between the largest and smallest eigenvalues of a matrix which is known as the condition number K of the matrix. The condition number is an indication of how sensitive matrix computations would be to small perturbations of the elements of the matrix. The higher K is, the more ill-conditioned the matrix, and the less suitable it is for practical computations.

The SVD of a matrix has numerous applications in practical computations. Advantages of this decomposition are well known in the art. (See for example Gene H. Golub and Charles F. van Loan, "Matrix Computations," The Johns Hopkins University Press, Baltimore, Md., 1983, and Gilbert Strang, "Linear Algebra And Its Applications," Harcourt Brace Jovanovic, Publishers, 1988 for an extensive discussion of the topic). For the purposes of the present invention, it is important to note that the SVD of a matrix can be used to find an optimal in least squares sense solution to the normal equations, guaranteed to be numerically as stable as possible. Furthermore, the amplitudes of the singular values provide an indication of the rank and condition number of the matrix and thus the stability of the solution to the normal equations.

Figure 6:
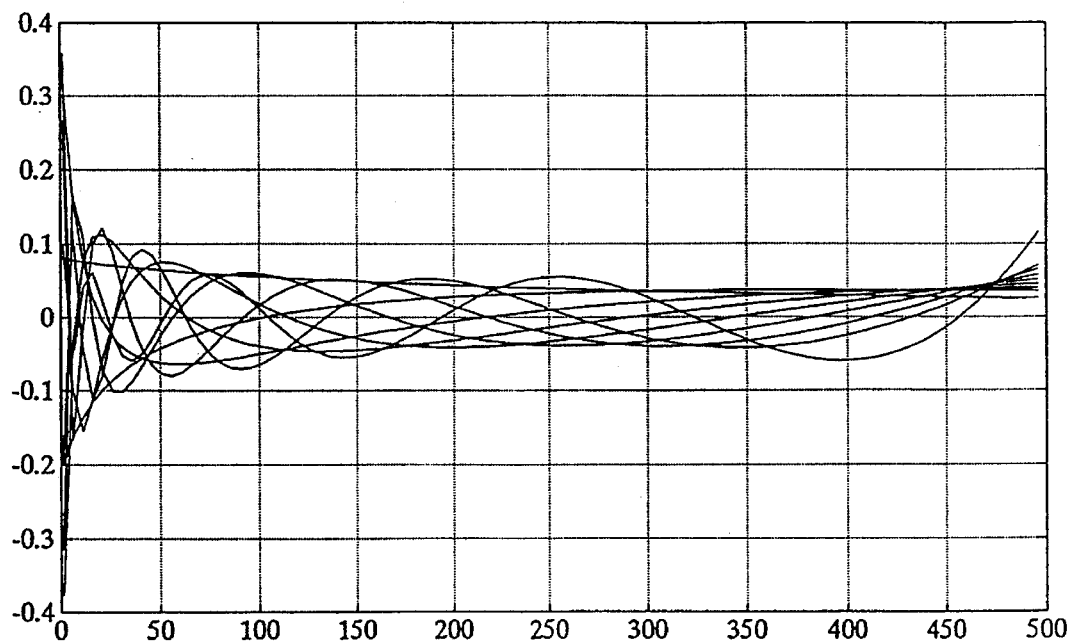
FIG. 6 illustrates a set of orthogonal basis functions, obtained from an SVD transformation of a matrix incorporating the basis functions in FIG. 5.

FIG. 6 illustrates the column vectors (column space) of the orthogonal matrix U in the SVD of the matrix A, incorporating the basis functions in FIG. 5. The column vectors of the matrix U are orthogonal, in the sense that the inner vector product of any two of them is equal to zero. The singular values in this example are determined to range from 26.8–0.004. The ratio between the largest and the smallest singular value in this case is about 6700 which indicates that the matrix is ill-conditioned.

In step 200 of the method, the SVD of the basis function matrix A is computed and possibly stored. In step 300, the SVD of the submatrices of the basis function matrix A is computed and stored. This step generally involves taking out one column of the matrix A at the time and repeating the steps of computing and storing the SVD decomposition of the remaining submatrices. This step is repeated until all submatrices of basis functions which are expected to appear in the actual measurement are computed and stored. Step 300 is the last step in the pre-processing stage of the present method. Generally, the pre-processing stage contains all computationally intensive tasks in the analysis of NMR signals in accordance with the present invention.

The second stage of the method is the actual NMR measurement which is typically computed on-line. The NMR measurement stage comprises step 10 of imparting a polarizing magnetic field signal to a material under investigation for a predetermined period of time. Specifically, this may involve generating a static magnetic field substantially perpendicular to the longitudinal axis 8 of bore hole 7 in a region 9 surrounding the bore hole which region includes material to be analyzed, and generating a radio frequency magnetic field in this region in a direction substantially perpendicular to both the axis of the bore hole and to the static magnetic field for exciting nuclei of the material sought to be analyzed. The parameters of the applied magnetic field may be determined in accordance with a number of well known techniques, such as those disclosed in U.S. Pat. Nos. 4,710,713; 4,717,876; 4,717,877; 4,717,878, or 5,023,551 which are herein explicitly incorporated for this purpose.

Figure 4:
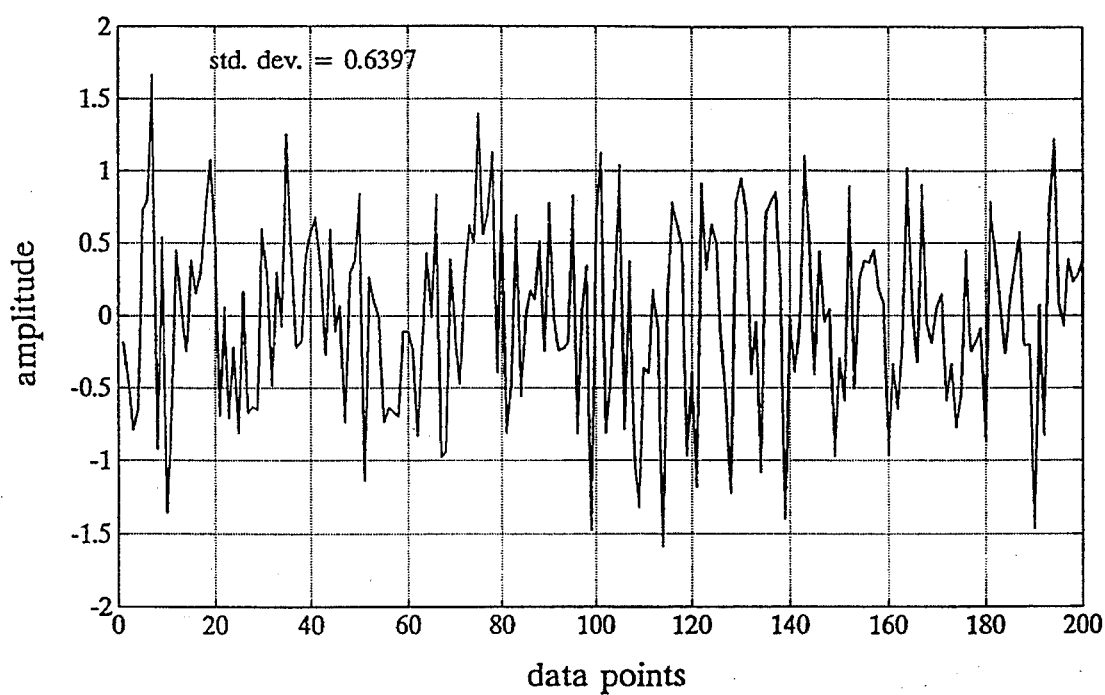
FIG. 4 presents a portion of the received NMR echo signal used to estimate the variance of the measurement noise.

In step 20, following the polarization period the received signal from a population of particles in the material under investigation in the NMR-measurement is obtained and stored in computer 32. The received echo signal is sampled and digitized at a pre-determined sampling rate. In step 30 of the method, a parameter which corresponds to the signal-to-noise ratio of the received signal is computed. FIGS. 3 and 4 illustrate one embodiment of the method for determining the signal-to-noise ratio parameter.

In accordance with this embodiment, the SNR parameter is determined as the ratio between the estimated signal amplitude versus the square root of the estimated noise variance. To determine the variance of the measurement noise, samples of the measurement vector which correspond to the stationary value of the signal after the completion of the relaxation process may be isolated. By fitting a straight line to this portion of the received signal and computing the deviation of the actual signal from this line one can obtain an estimate of the measurement noise for the particular measurement.

In FIG. 4, the last 200 time samples of the received signal were separated and the value of the signal variance for this particular segment of the signal computed. The signal in FIG. 4 is essentially due to thermal noise only and can be used to estimate the noise variance for a particular experiment. The measured standard deviation of the noise in this example is 0.64.

The signal amplitude may be determined by various methods. For instance, one simple approach is to take the average of the first few samples obtained immediately after the polarization period. Using this approach, in the example in FIG. 4, the estimated SNR parameter was found approximately equal to 20.

As well known in the art, other methods for estimating the SNR of the measurement may also be used, as shown in Harold Sorenson, "Parameter Estimation, Principles and Problems," Marcel Dekker, Inc., 1980.

In step 40 is constructed a mapping of the NMR measurement vector from the signal space into a parameter space of the basis function matrix, which step corresponds to solving the matrix equation $Ax \cong b$, as defined above, and obtaining a least-squares solution vector x, the components of which are parameters of the desired approximation of the received signals.

An important element of the present invention is the insight that the estimate of the SNR of the received measurement data obtained in step 30 can be used to adjust the condition number K of the matrix A prior to solving the normal equations. The idea is that for high SNR of the measurement signal, the condition number K can be made larger, without introducing undue instability. Conversely, for a low SNR, there is less confidence in the measurement data and the condition number K should be kept small, in order to obtain a meaningful solution. In some prior art, the adjustment of the condition number to increase the numerical stability of the computation is done by excluding small singular values, setting them equal to zero. One problem is, however, that using this approach, the adjustment can only be done in discrete steps and therefore K may be either too high or too low for a particular measurement. Relatively small changes in the SNR of the measurement signal would result in jumps in the condition number K and consequently in large differences in the solutions.

In accordance with the present invention, the concept of a fractional matrix rank related to a specific measurement, and thus to a specific set of equations, solves this problem. The matrix system $Ax \cong b$ is solved in a least-squares sense by applying a weighing of the singular values of the matrix A by factors which depend on the value of the SNR parameter. Mathematically, this may be expressed as multiplying the diagonal matrix S by a diagonal matrix $T = \text{diag}(1,1, \ldots, 1, w, 0, 0, \ldots, 0)$.

In accordance with the proposed method, the SNR parameter is compared to the ratio of the largest singular value to all singular values of the basis function matrix A. Basis functions which correspond to singular values for which the ratio is smaller than the SNR parameter are fully retained in the computed solution. Basis functions which correspond to singular values for which the ratio is larger than the SNR parameter are excluded from further consideration, by setting the corresponding singular values of the matrix equal to zero. Removing smaller singular values from the computation effectively stabilizes the numerical solution of the system for a given measurement SNR.

If the estimated SNR parameter falls between two ratios, one may also define a measure of confidence or a "fractional rank" of the matrix with respect to the particular measurement. Specifically, the integer part of the matrix rank may be determined as the order of the singular value corresponding to the smaller amplitude ratio, while the fractional part may be determined by some measure related to how close the SNR parameter is to the larger ratio. The correspondent singular value of the matrix is weighted dependent on the fractional part of the matrix rank for the specific measurement.

In a preferred embodiment of the present invention, the fractional part of the matrix rank for a particular measurement may be determined using the geometric correlation formula:

$$(SNR-S(1,1)/S(i,i))/(S(1,1)/S(i+1,i+1)-S(1,1)/S(i,i))$$

where i is the index of the singular value for which the ratio is smaller, and i+1 is index of the singular value for which the ratio is larger than the SNR parameter. A specific example of the computation of the fractional rank of a matrix with respect to an estimated SNR parameter is illustrated in Appendix A.

In step 50, the proposed method imposes a feasibility constraint on the solution of the matrix equation, which is the requirement that the components of the solution vector be non-negative. Physically, this constraint corresponds to the requirement that the approximating functions are actually present in the measurement signal, as opposed to being a mathematical abstraction. Another feasibility constraint which is automatically met when using SVD of the basis function matrix is to minimize the sum of the squared amplitudes of the approximation error.

After the weighing of the singular values of the matrix is complete, the solution of the matrix system may be found as known in the art. If none of the components of the solution vector is negative, in accordance with the present invention, the approximation parameters are found and can be used to determine attributes of the material under investigation. Should one or more of the solution vector components have a negative value, the method proceeds by excluding from consideration the basis function corresponding to the solution vector component having the negative most value. The corresponding component of the solution vector is set to zero and the analysis is repeated for a submatrix of the original basis function matrix having the correspondent basis function removed. The steps of the method are repeated until all solution vector components are non-negative. Notice that the SVD of the submatrices involved in the process is computed off-line in step 300 of the preprocessing stage, so one only has to determine which submatrix is to be used and apply the stored matrix decomposition.

In step 60 of the method, having found a feasible solution vector, one can compute the model response, which is an approximation of the measurement signal using the pre-selected basis functions. In one embodiment of the present invention, following this step, the error between the measured signal and its approximation may be computed and evaluated using some statistical criteria to determine how good the approximation is. If the approximation is found to be unsatisfactory, one may repeat the NMR measurements a predetermined number of times and effectively increase the SNR of the measurement by averaging the received signal data prior to solving for the approximating parameters.

One example of a statistical measure of goodness criterion is the standard $\chi^2$ test which is defined as the sum of the squared differences between the measurement signal and the approximation signal, divided by the square of the standard deviation of the noise. The approximation is considered good if the $\chi^2$ parameter has a value close to or less than the number of points over which the approximation is computed. Other possible criteria include the standard mean squared test. For a more detailed discussion of the topic see for example the above referenced Sorenson book.

Figure 7:
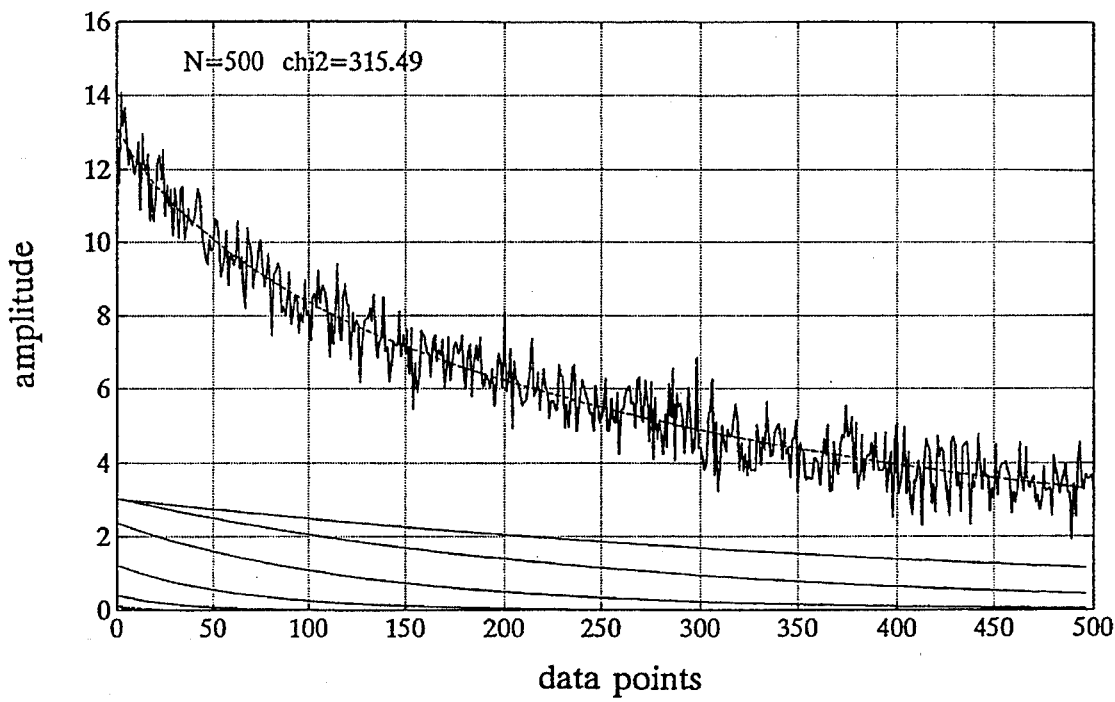
FIG. 7 illustrates the approximating function obtained in accordance with the present invention, superimposed on the received measurement signal, and the basis functions used in the approximation.

FIG. 7 illustrates the measurement signal as in FIG. 3 (solid line), and its approximation (dotted line) in accordance with the method of the present invention, using the pre-selected basis functions in FIG. 5. The five exponential functions which were used in the approximation are also shown in FIG. 7, weighted by their respective amplitude constants. The approximation of the measurement signal is done over 500 measurement points. The $\chi^2$ error criterion in this case is measured to be 315 which indicates a very good approximation fit.

The computations involved in the method of the present invention are relatively straightforward and can simply be implemented using a number of software packages available on the market. For example, all computations involved in the signal analysis above may be done using the MATLAB scientific and technical computations package, distributed by the Math Works Corporation, Inc., 24 Prime Park Way/ Natick Mass. 01760.

In step 70 of the method, the NMR signal model is finally used to estimate the desired parameters of the material under investigation such as the typical pore size of the earth formation and others. Methods for computing such parameters from the signal approximation model are well-known in the literature and are considered at length, for example in U.S. Pat. Nos. 4,710,713; 4,717,876; 4,717,877; 4,717,878; and 5,023,551.

Figure 8:
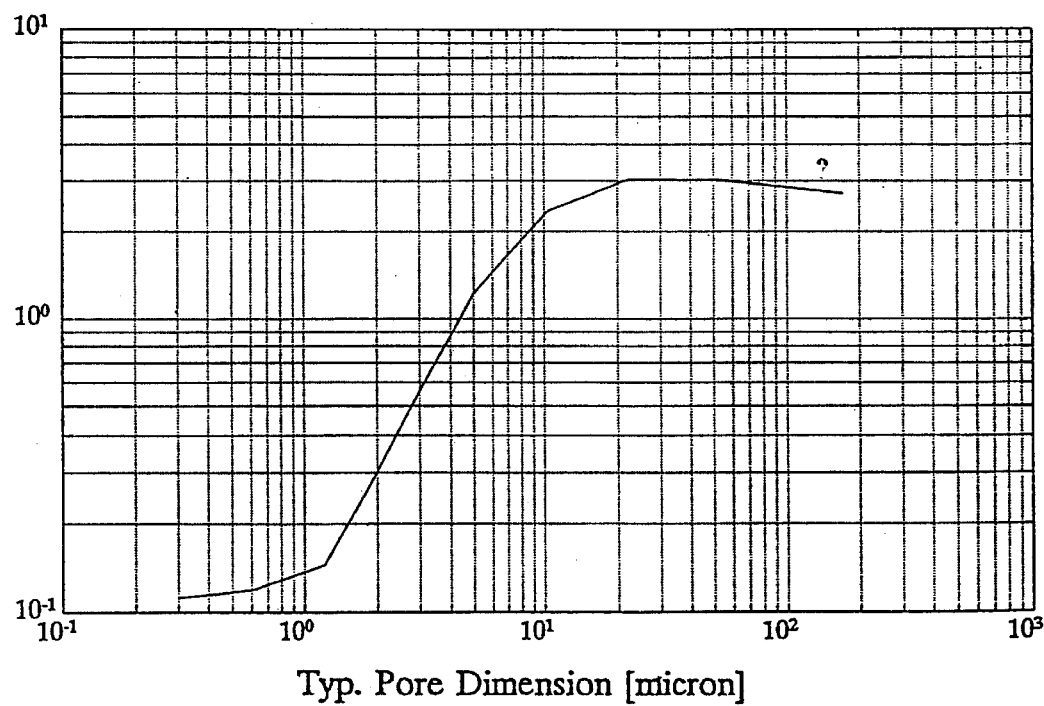
FIG. 8 is a mapping of the estimated NMR signal decay times into pore sizes of the investigated earth formation.

Step 70 of the method typically involves determining at least a value for the spin-lattice relaxation time ($T_1$) of the material from the provided approximation of the received signal. FIG. 8 is a plot of the typical pore dimensions versus the computed magnitude of the relaxation times on a logarithmic scale. The illustrated mapping can experimentally relate relaxation times to pore sizes of the earth sample being investigated. The mapping in FIG. 8 can be constructed using empirical data and simulation studies of diffusion phenomena in restricted geometries.

As seen in FIG. 8, the larger the pore size for the particular sample, the longer is the typical diffusion path, and the longer is the relaxation time. The data becomes ambiguous at the long-relaxation time end of the axis, as other relaxation mechanisms compete with surface relaxation alone. As clear from the example, practically no pores with less than 1 micron in radius are present, and the bulk of the water is stored in pores of sizes 10 to 100 microns.

Having such conversion mapping, the operator of the well logging apparatus in accordance with the present invention may determine on-line whether the particular well logging site has a potential for oil exploration or not. Note that all measurements and computations in the measurement stage can be done in real time. This feature of the present invention makes it possible to offset even the logging speed of the apparatus which often results in approximation errors. Thus, at the end of the measurement the operator may immediately report on the potential of the given logging site.

In Appendix A is presented a detailed explanation of the method of the present invention at the example of a simulated NMR measurement analysis. The notations in this example are as adopted in the MATLAB computational software.

In addition to NMR measurements, the method of the present invention can be used in the processing of magnetic resonance imaging (MRI) signals. In this case, a body to be imaged may be scanned using data from a NMR scanner. Data from the NMR scanner is sampled, digitized and stored for further processing. As explained above, a mapping of the scanned data can be constructed from the data space into a parameter space associated with a predetermined set of basis functions. In one embodiment of the present invention, two-dimensional MRI scan data may be converted to a single dimensional data array by any of the known in the prior art techniques. The application of the method in this case may proceed as described above, with the basis functions being modified accordingly. Notably, the application of the method in such case would result in even higher computational savings realized in computing the SVD decompositions of the corresponding basis function matrices off-line. The provided MRI image approximations are lastly displayed in a man readable form as well known in the art.

It is to be expressly understood that the claimed invention is not to be limited to the description of the preferred embodiment and the illustrative example but encompasses other modifications within the spirit of the inventive concept which scope is defined by the accompanying claims.

APPENDIX A

The following example is an illustration of the method of the present invention in the approximation of a simulated NMR echo signal. For the purposes of illustration it is assumed that the echo signal from the underlying relaxation process is represented by a single exponentially decaying function with an amplitude A=10 and time constant T=20. If the uncorrupted echo signal $y_a=10*\exp(-t/20)$ is sampled at ten unit time intervals, the resulting uncorrupted vector $y_a$ is:

$y_a$=(9.5123, 9.0484, 8.6071, 8.1873, 7.7880, 7.4082, 7.0469, 6.7032, 6.3763, 6.0653)$^t$ where $^t$ denotes the transpose vector.

Suppose next, that vector $y_a$ is contaminated with normally distributed random measurement noise, having zero mean and unit variance n(0,1). The result is a simulated measurement vector y:

$y=y_a+n(0,1)$

For a specific realization of the noise process, the measurement vector y is given by:

y=(8.4141, 10.1710, 9.1887, 7.9160, 8.2022, 6.4304, 6.0254, 7.0209, 7.8924, 6.8147)$^t$

Assume next that three basis functions are used in the approximation of the measurement vector y. The basis functions have functional description similar to that of the expected true measurement signal, a decaying exponent. The selected basis functions have time constants $T_1=3$, $T_2=10$ and $T_3=30$ and amplitudes $a_i$ to be determined.

| | | |
|---|---|---|
| $f1$ = | exp(−t/3) | $1 \leq t \leq 10$ |
| $f2$ = | exp(−t/10) | $1 \leq t \leq 10$ |
| $f3$ = | exp(−t/30) | $1 \leq t \leq 10$ |

To find the unique combination of basis vectors approximating in an optimal way the measurement vector we proceed in accordance with the method of the present invention as follows:

1. Sample the basis functions at one unit time interval and arrange the resulting vectors f1, f2, and f3 as columns of the basis functions matrix A:

$$A = \begin{vmatrix} 0.7165 & 0.9048 & 0.9672 \\ 0.5134 & 0.8187 & 0.9355 \\ 0.3679 & 0.7408 & 0.9048 \\ 0.2636 & 0.6703 & 0.8752 \\ 0.1889 & 0.6065 & 0.8465 \\ 0.1353 & 0.5488 & 0.8187 \\ 0.0970 & 0.4966 & 0.7919 \\ 0.0695 & 0.4493 & 0.7659 \\ 0.0498 & 0.4066 & 0.7408 \\ 0.0357 & 0.3679 & 0.7165 \end{vmatrix}$$

2. Compute and store the SVD of matrix $A=USV^T$:

$$U = \begin{vmatrix} 0.4270 & -0.6260 & 0.4562 \\ 0.3898 & -0.3293 & -0.0651 \\ 0.3586 & -0.1165 & -0.3117 \\ 0.3320 & 0.0359 & -0.3765 \\ 0.3090 & 0.1445 & -0.3245 \\ 0.2888 & 0.2216 & -0.2009 \\ 0.2710 & 0.2757 & -0.0370 \\ 0.2550 & 0.3132 & 0.1462 \\ 0.2406 & 0.3386 & 0.3343 \\ 0.2275 & 0.3551 & 0.5183 \end{vmatrix}$$

$$S = \begin{vmatrix} 3.4128 & 0.0000 & 0.0000 \\ 0.0000 & 0.6039 & 0.0000 \\ 0.0000 & 0.0000 & 0.0728 \end{vmatrix}$$

$$V^T = \begin{vmatrix} 0.2599 & -0.8539 & 0.4508 \\ 0.5773 & -0.2368 & -0.7814 \\ 0.7741 & 0.4633 & 0.4314 \end{vmatrix}$$

3. If the preprocessing computation is done off-line, compute and store the SVD of the reduced-size submatrices resulting from the removal of each basis function.

4. Estimate the SNR parameter for the particular measurement from the data vector y and the known standard deviation of the noise. In this example, the noise variance is known to be unity. The signal amplitude is estimated from an average of the first two samples of the received signal. The SNR parameter used in the following computations is thus:

$SNR=((y(1)+y(2))/2)/1=9.33399$

5. The degree of certainty, or the fractional rank of the basis function matrix, with respect to the particular measurement is determined by comparing the ratios $S(1,1)/S(2,2)=5.6516$ $S(1,1)/S(3,3)=46.8704$ with SNR=9.33390.

The SNR parameter is larger than the ratio of the first and the second, but smaller than the ratio of the first and the third singular values. Therefore, we estimate that the "fractional rank" of the matrix A is between 2 and 3 and compute it more accurately by using the formula:

$(SNR-S(1,1)/S(2,2))/(S(1,1)/S(3,3)-S(1,1)/S(2,2))=0.089337$

Therefore, for this measurement signal the fractional rank of the basis function matrix is equal to 2.089337.

6. Compute the parameters of the first signal approximation. To this end, compute the projection (inner vector product) of the measurement vector y with respect to the first and second column vectors of the U matrix, scale the result by the inverse of the corresponding singular value $S_i$ and multiply the resulting constant by the corresponding vector of the V matrix.

$$a=(y*U(:,1))/S(1,1) \times V(:,1)+(y*U(:,2))/S(2,2) \times V(:,2)$$

where y is the measurement vector; U(:,i) is the i-th column vector of the U matrix, V(:,i) is the i-th column vector of the V matrix; S(i,i) is the corresponding singular value, and the notation y*U(:,i) denotes the inner product of the vectors y and U(:,i).

Next, a single equation weighted by the fractional rank is included for the last basis function projection:

$$a=a+0.089337\ (y*U(:,3))/S(3,3) \times V(:,3)$$

$$a = \begin{vmatrix} -0.9756 \\ 2.9996 \\ 7.4568 \end{vmatrix}$$

7. Since the first component of the solution vector a is negative, remove the corresponding vector from the basis set, i.e. mark $f_1$ as not feasible.

8. Form a new (reduced) matrix A' using only the basis functions $f_2$ and $f_3$ which were found feasible:

$$A' = \begin{vmatrix} 0.9048 & 0.9672 \\ 0.8187 & 0.9355 \\ 0.7408 & 0.9048 \\ 0.6703 & 0.8752 \\ 0.6065 & 0.8465 \\ 0.5488 & 0.8187 \\ 0.4966 & 0.7919 \\ 0.4493 & 0.7659 \\ 0.4066 & 0.7408 \\ 0.3679 & 0.7165 \end{vmatrix}$$

9. Compute the SVD of the new matrix A':

$$U' = \begin{vmatrix} 0.3989 & -0.5254 \\ 0.3756 & -0.3511 \\ 0.3541 & -0.1975 \\ 0.3342 & -0.0625 \\ 0.3157 & 0.0559 \\ 0.2985 & 0.1593 \\ 0.2825 & 0.2493 \\ 0.2677 & 0.3273 \\ 0.2539 & 0.3945 \\ 0.2410 & 0.4521 \end{vmatrix}$$

$$S' = \begin{vmatrix} 3.2985 & 0.0000 \\ 0.0000 & 0.2889 \end{vmatrix}$$

$$V'^T = \begin{vmatrix} 0.5950 & -0.8037 \\ 0.8037 & 0.5950 \end{vmatrix}$$

10. Calculate the new effective rank:
Since 1.0000<SNR=9.333990<S(1,1)/S(2,2)=11.4174, the rank is between 1 and 2. The fractional part is found to be:
(SNR−S(1,1)/S(1,1))/(S(1,1)/S(2,2)−S(1,1)/S(1,1))=0.8

In the second iteration of the method the fractional rank of the basis function matrix with respect to the measurement vector is Rank=1.8

11. Repeating the steps of computing the solution vector for the amplitudes of the basis functions, we find:

$$a = \begin{vmatrix} 0.0 \\ 1.8600 \\ 7.9820 \end{vmatrix}$$

12. Since all amplitudes are now non-negative, we have found the solution (otherwise, we would have marked another basis function as infeasible and repeated step 7). The solution for the unknown amplitudes of the basis functions used in the approximation is given by the vector a $$a=(0.0000,\ 1.8600,\ 7.9820)^t$$

13. To find the desired approximation function in accordance with the present method we use the formula:

$$\begin{aligned} y_{fit} &= 0.0000*f_1 + 1.8600*f_2 + 7.9820*f_3 \\ &= (9.4033,\ 8.9901,\ 8.6004,\ 8.2325,\ 7.8848,\ 7.5559, \\ &\quad 7.2445,\ 6.9494,\ 6.6695,\ 6.4036)^t \end{aligned}$$

14. A measure of goodness of the approximation is given by the $\chi^2$ fitting error which in this case is computed as:

$$\chi^2 = \Sigma(y-y_{fit})^2/1) = 7.3432$$

The $\chi^2$ error is close to the number of data points which is an indication that the approximation is good in some statistical sense. To obtain another measure of how good the approximation is, we can compute the mean-square error by comparing the approximation to the original function:

$$\text{Error} = \Sigma(y'-10*\exp(-t/20))^2) = 0.3487$$

This error is similarly small, indicating that the approximation is good and may be used to determine parameters of the material under investigation as known in the art.

What is claimed is:

1. A method for nuclear magnetic resonance (NMR) sensing of a material under investigation, comprising the steps of:

(a) imparting a polarizing magnetic field signal to the material for a predetermined period of time;

(b) receiving NMR signals from a population of particles in the material, following the polarization period;

(c) constructing a mapping of the received signals from the signal space into a parameter space associated with a predetermined set of basis functions, wherein the mapping step comprises the steps of:

1. sampling and digitizing of the received signals to obtain a measurement vector b;

2. defining a matrix A incorporating information about the set of basis functions and forming a linear system of equations for the defined matrix A and measurement vector b;

3. solving the system of linear equations Ax=b to obtain a solution vector x to provide an approximation of the received signals; wherein the solution is obtained by applying an orthogonal decomposition to matrix A; and (d) determining from the provided approximation an indication of attributes of the material under investigation; wherein only basis functions for which the corresponding component of the solution vector is non-negative are used in obtaining the approximation parameters, and steps 2–3 are iterated until a non-negative solution vector is obtained by defining at each iteration a reduced size matrix $A_i'$ for which the i-th basis function corresponding to the component of the solution vector x having the largest negative amplitude is removed.

2. The method of claim 1 wherein said orthogonal decomposition applied to matrix A is a singular value decomposition.

3. The method of claim 2 wherein said singular value decomposition to said matrix A is applied prior to step (a) of imparting a polarizing magnetic field signal.

4. The method of claim 3 further comprising the step of storing the singular value decomposition of said matrix in storage means.

5. The method of claim 2 wherein in step (3) of solving only singular values of said matrix A, larger than a predetermined threshold are used.

6. The method of claim 5 wherein the value of the threshold parameter is dependent on the signal-to-noise ratio of the received NMR signals.

7. The method of claim 5 further comprising the step of weighting the singular values of said matrix in accordance with the threshold parameter, prior to the step of solving.

8. The method of claim 2 wherein the step of applying singular value decomposition to the matrix A and the reduced size matrices $A_i'$ corresponding to having the i-th basis function removed is performed off-line prior to the step of imparting a polarizing magnetic field signal.

9. The method of claim 1 wherein the set of basis functions comprises exponentially decaying functions $\exp(-t/T_i)$ with different time constants $T_i$.

10. The method of claim 9 wherein the time constants $T_i$ of the basis functions are selected as powers of 2.

11. The method of claim 1 further comprising the step of evaluating the goodness of the approximation by using a statistical goodness measure criterion.

12. The method of claim 11 wherein steps (a) and (b) are repeated a predetermined number of times and the received signals are averaged prior to applying step (c) to improve the signal-to-noise ratio of the measurement data.

13. The method of claim 2 wherein step (d) comprises determining at least a value for a spin-lattice relaxation time $(T_1)$ of the material from the provided approximation of the received signal.

14. The method of claim 13 further comprising the step of determining at least a value of the typical pore dimensions of the material under investigation from the value of the relaxation time constant $T_1$.

15. A method for processing NMR signals in well logging comprising the steps of:
  (a) generating a static magnetic field substantially perpendicular to the axis of a bore hole in a region surrounding the bore hole which region includes material sought to be analyzed;
  (b) generating a radio frequency magnetic field in said region in a direction substantially perpendicular to both the axis of the bore hole and to the static magnetic field for exciting nuclei of the material sought to be analyzed;
  (c) receiving NMR signals from the excited nuclei;
  (d) constructing a mapping of the received signals from the signal space into a parameter space associated with a predetermined set of basis functions, wherein the mapping step comprises obtaining parameters to provide an approximation of the received signals, and further comprises the steps of:
    (1) defining a matrix incorporating information about the set of basis functions;
    (2) forming a linear system of equations for the defined matrix and a measurement vector constructed from the received NMR measurement signals;
    (3) solving the linear system of equations to obtain parameters providing an approximation of the received signals; wherein the solution of the linear system of equations is obtained by applying a singular value decomposition to the defined matrix and by weighting the singular values of the matrix in accordance with a parameter dependent on the signal-to-noise ratio of the received signal measurement; and
  (e) determining from the obtained parameters an indication of attributes of the material sought to be analyzed.

16. The method of claim 15 wherein the steps of defining the matrix incorporating information about the set of basis functions and of applying singular value decomposition to the defined matrix are performed off-line prior to step (a) of generating a static magnetic field.

17. The method of claim 15 wherein the singular values of the matrix are weighted by factors depending on the fractional rank of the matrix with respect to the particular measurement, where the fractional rank of the matrix is determined by comparing the ratios between the largest and all other singular values of the defined matrix and the value of the parameter dependent on the signal-to-noise ratio of the received signal measurement.

18. The method of claim 15 wherein following the step of solving, only basis functions for which the corresponding component of the solution vector is non-negative are used in obtaining the approximation parameters.

19. The method of claim 18 wherein steps (1–3) are repeated using a reduced size matrix incorporating information about the set of basis functions for which the basis function corresponding to the component of the solution vector having the largest negative amplitude is removed.

20. The method of claim 15 wherein the set of basis functions comprises exponentially decaying functions $\exp(-t/T_i)$ with different time constants $T_i$.

21. The method of claim 20 wherein the time constants $T_i$ of the basis functions are selected as powers of 2.

22. The method of claim 15 further comprising the step of repeating steps (a)–(c) a predetermined number of times and averaging the received signals prior to applying step (d) to improve the signal-to-noise ratio of the measurement data.

23. The method of claim 15 wherein step (e) comprises determining at least a value of the typical pore dimensions of the material under investigation from the values of the obtained parameters.

24. An apparatus for nuclear magnetic resonance (NMR) sensing comprising:
  (a) at least one magnet having a longitudinal axis to provide substantially uniform magnetization along an axis perpendicular to said longitudinal axis;
  (b) means for causing said at least one magnet to generate a static magnetic field of generally uniform amplitude in a region remote therefrom containing materials sought to be analyzed, said static magnetic field having a static field direction perpendicular to said longitudinal axis in said remote region;
  (c) means for generating a radio frequency magnetic field in said remote region for exciting nuclei of the material sought to be analyzed and having a radio frequency magnetic field direction substantially perpendicular to both said longitudinal axis and to said static field direction;

(d) means for receiving NMR measurement signals from the excited nuclei;

(e) means for constructing a mapping of the received signals from the signal space into a parameter space associated with a predetermined set of basis functions, wherein the mapping means receives input from the receiving means and comprises means for obtaining parameters to provide an approximation of the received signals; wherein said mapping means further comprises:

1) means for defining a matrix incorporating information about the set of basis functions;
2) means for forming a linear system of equations for the defined matrix and a measurement vector constructed from the received NMR measurement signals; and
3) means for solving the system of linear equations to obtain parameters to provide an approximation of the received signals;

wherein said means for solving comprises means for applying a singular value decomposition to the defined matrix and means for weighting the singular values of the matrix; and (f) means for determining from the provided approximation an indication of attributes of the material sought to be analyzed.

25. The apparatus of claim 24 further comprising means for estimating the SNR of the received measurement signals and means for supplying the estimated SNR to said weighting means.

26. The apparatus of claim 24 wherein the set of basis functions comprises exponentially decaying functions $\exp(-t/T_i)$ with different time constants $T_i$.

27. The apparatus of claim 24 further comprising means for averaging the received measurement signals to improve the SNR of the measurement data.

28. The apparatus of claim 24 wherein said means for determining comprises means for determining at least a value of the typical pore dimensions of the material under investigation.

29. The apparatus of claim 24 further comprising means for storing the singular value decomposition to the defined matrix.

* * * * *